United States Patent
Baumgartner et al.

(10) Patent No.: US 12,211,964 B2
(45) Date of Patent: Jan. 28, 2025

(54) RADIATION EMITTING DEVICE AND METHOD OF MANUFACTURING A RADIATION EMITTING DEVICE

(71) Applicant: OSRAM Opto Semiconductors GmbH, Regensburg (DE)

(72) Inventors: Alexander Baumgartner, Donaustauf (DE); T'ing Qi'ao Leow, Pulau Pinang (MY); Tomin Liu, Kuching (MY); Kathy Schmidtke, Obertraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 465 days.

(21) Appl. No.: 17/421,468

(22) PCT Filed: Dec. 18, 2019

(86) PCT No.: PCT/EP2019/085954
§ 371 (c)(1),
(2) Date: Jul. 8, 2021

(87) PCT Pub. No.: WO2020/144029
PCT Pub. Date: Jul. 16, 2020

(65) Prior Publication Data
US 2022/0059741 A1 Feb. 24, 2022

(30) Foreign Application Priority Data

Jan. 11, 2019 (DE) .................. 102019100646.5

(51) Int. Cl.
*H01L 33/58* (2010.01)
*H01L 33/56* (2010.01)
(Continued)

(52) U.S. Cl.
CPC .............. *H01L 33/58* (2013.01); *H01L 33/56* (2013.01); *H01S 5/02234* (2021.01);
(Continued)

(58) Field of Classification Search
CPC ..... H01L 33/58; H01L 33/502; H01L 33/507; H01L 33/52; H01L 33/56;
(Continued)

(56) References Cited

U.S. PATENT DOCUMENTS

2006/0105483 A1* 5/2006 Leatherdale ............ H01L 33/56
257/E33.059
2009/0001390 A1* 1/2009 Yan ........................ H01L 33/56
257/89
(Continued)

FOREIGN PATENT DOCUMENTS

CN 104009132 A 8/2014
DE 102012106984 A1 2/2014
(Continued)

OTHER PUBLICATIONS

Huang, Pei, et al., "High performance surface-modified TiO2/silicone nanocomposite," Scientific Reports, Jul. 20, 2017, 7 pages.

*Primary Examiner* — Kyoung Lee
*Assistant Examiner* — Christina A Sylvia
(74) *Attorney, Agent, or Firm* — Slater Matsil, LLP (57) ABSTRACT

In an embodiment a radiation emitting device includes a semiconductor chip configured to emit electromagnetic radiation of a first wavelength range from a radiation exit surface and a potting comprising a matrix material and a plurality of nanoparticles, wherein a concentration of the nanoparticles in the matrix material decreases starting from the radiation exit surface of the semiconductor chip so that a refractive index of the potting decreases starting from the radiation exit surface of the semiconductor chip, and wherein the nanoparticles are coated with a shell.

18 Claims, 4 Drawing Sheets

(51) Int. Cl.
  *H01S 5/02234* (2021.01)
  *H01L 33/50* (2010.01)
(52) U.S. Cl.
  CPC .......... *H01L 33/502* (2013.01); *H01L 33/507* (2013.01); *H01L 2933/0041* (2013.01); *H01L 2933/005* (2013.01)
(58) Field of Classification Search
  CPC ....... H01L 2933/0041; H01L 2933/005; H01S 5/02234
  See application file for complete search history.

(56) References Cited

U.S. PATENT DOCUMENTS

| | | | | |
|---|---|---|---|---|
| 2012/0112219 | A1* | 5/2012 | Jang | B82Y 20/00 362/267 |
| 2014/0022779 | A1* | 1/2014 | Su | H01L 33/504 362/231 |
| 2014/0023855 | A1* | 1/2014 | Masuda | C08J 7/043 252/588 |
| 2014/0246689 | A1* | 9/2014 | Luo | H01L 33/504 257/98 |
| 2016/0218252 | A1* | 7/2016 | Steckel | H01L 33/501 |
| 2016/0248252 | A1* | 8/2016 | Pishdadian | H02M 1/08 |
| 2016/0322542 | A1* | 11/2016 | Akagawa | C09K 11/77348 |
| 2017/0368535 | A1* | 12/2017 | Chopra | B01J 23/52 |

FOREIGN PATENT DOCUMENTS

| | | | | |
|---|---|---|---|---|
| DE | 102012109754 | A1 | 4/2014 | |
| JP | 2017050543 | A * | 3/2017 | ....... H01L 21/02601 |
| KR | 20160051935 | A | 5/2016 | |

\* cited by examiner

RADIATION EMITTING DEVICE AND METHOD OF MANUFACTURING A RADIATION EMITTING DEVICE

This patent application is a national phase filing under section 371 of PCT/EP2019/085954, filed Dec. 18, 2019, which claims the priority of German patent application 102019100646.5, filed Jan. 11, 2019, each of which is incorporated herein by reference in its entirety.

TECHNICAL FIELD

A radiation emitting device is disclosed. In addition, a method of manufacturing a radiation emitting device is disclosed.

SUMMARY

Embodiments provide a radiation emitting device with increased efficiency and/or better decoupling properties. Further embodiments provide a method for manufacturing such a radiation emitting device.

According to an embodiment, the radiation emitting device comprises a semiconductor chip that emits electromagnetic radiation of a first wavelength range from a radiation exit surface during operation. The semiconductor chip is, for example, a light emitting diode chip or a laser diode chip. Preferably, the semiconductor chip has an epitaxially grown semiconductor layer sequence with an active zone suitable for generating electromagnetic radiation. For this purpose, the active zone has, for example, a pn junction, a double heterostructure, a single quantum well structure or, particularly preferably, a multiple quantum well structure. Preferably, the semiconductor chip emits electromagnetic radiation from the ultraviolet spectral range or from the visible spectral range, particularly preferably from the blue spectral range, during operation.

According to a further embodiment, the radiation emitting device has a potting. The potting may partially or completely surround the semiconductor chip. Preferably, the semiconductor chip is embedded in the potting. Preferably, the semiconductor chip is surrounded by the potting. Particularly preferably, the surface of the semiconductor chip opposite the radiation exit surface is arranged on a carrier element for stabilization and is not surrounded by the potting.

According to another embodiment, the potting comprises a matrix material and a plurality of nanoparticles. Preferably, the matrix material comprises or consists of a polymer.

For example, a diameter of the nanoparticles is between at least 1 nanometer and at most 100 nanometers, preferably at most 30 nanometers. By introducing nanoparticles into the matrix material, the optical properties of the potting can be adjusted in a desired manner.

According to a preferred embodiment, a concentration of the nanoparticles in the matrix material decreases starting from the radiation exit surface of the semiconductor chip, so that a refractive index of the potting decreases starting from the radiation exit surface of the semiconductor chip. The nanoparticles in the matrix material are responsible for adjusting the refractive index of the potting. By varying the concentration of nanoparticles in the matrix material, the refractive index can be variably adjusted. In particular, the refractive index of the potting is higher in the vicinity of the semiconductor chip, preferably on the radiation exit surface of the semiconductor chip, than at the interface between potting and a medium surrounding the device. Advantageously, losses of electromagnetic radiation due to refractive index jumps between the interface of the potting and the medium surrounding the device are thus reduced. This leads to an increased decoupling of the electromagnetic radiation from the device.

According to a preferred embodiment, the radiation emitting device comprises a semiconductor chip that in operation emits electromagnetic radiation of a first wavelength range from a radiation exit surface, and a potting comprising a matrix material and a plurality of nanoparticles, wherein the concentration of nanoparticles in the matrix material decreases from the radiation exit surface of the semiconductor chip such that a refractive index of the potting decreases from the radiation exit surface of the semiconductor chip.

According to one embodiment, the refractive index of the potting decreases continuously starting from the radiation exit surface. In other words, the refractive index of the potting decreases continuously starting from the radiation exit surface of the semiconductor chip without refractive index jumps. That is, a portion of the potting located adjacent to the radiation exit surface of the semiconductor chip has a larger refractive index than a portion of the potting located farther away from the semiconductor chip. This advantageously leads to an increased decoupling of the electromagnetic radiation from the device, since the refractive index difference between the potting and the medium surrounding the device, for example air, is reduced. In comparison, conventional radiation emitting devices with highly refractive silicones as potting lead to a disadvantageous decoupling of the electromagnetic radiation from the device, since there is usually a significant refractive index jump at the interface between highly refractive silicones and the medium surrounding the device.

According to a further embodiment, a change in the refractive index is constant as a function of a distance from the radiation exit surface. That is, there is a linear decrease of the refractive index with increasing distance from the radiation exit surface.

According to one embodiment, the matrix material is selected from the group of polysiloxanes. Polysiloxanes are organosilicon compounds in which two silicon atoms are bonded to one another via an oxygen atom. Preferably, polysiloxanes have an organic group on the silicon atom. In particular, polysiloxanes are more strongly crosslinked after curing compared to conventional silicones. In the liquid state, polysiloxanes exhibit a low viscosity. In addition, polysiloxanes exhibit a high thermal stability and stability of electromagnetic radiation of the semiconductor chip in the cured state. For example, the organic group is a methoxy, methyl, phenyl or phenoxy group. The polysiloxane may also have multiple organic groups. The organic group of the polysiloxanes has a preferential influence on the refractive index of the matrix material.

According to a preferred embodiment, the nanoparticles comprise or consist of a material selected from the group consisting of metal oxides.

The metal oxides can be a transparent conductive oxide (TCO). Transparent conductive oxides are, for example, zinc oxide, tin oxide, cadmium oxide, titanium oxide, indium oxide or indium tin oxide (ITO). In addition to binary metal oxygen compounds, such as ZnO, $SnO_2$ or $In_2O_3$, ternary metal oxygen compounds, such as $Zn_2SnO_4$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs. Furthermore, the TCOs do not necessarily correspond to a stoichiometric composition and can also be p- as well as n-doped.

In addition, one of the following materials can be used as a metal oxide: $ZrO_2$, $BaTiO_3$, $SrTiO_3$, $Al_2O_3$, $Nb_2O_5$, $HfO_2$.

Preferably, the nanoparticles have at least one of the following materials: ZnO, $TiO_2$ and $ZrO_2$.

According to a further embodiment, the diameter of the nanoparticles is not larger than 10 nanometers. The diameter of the nanoparticles advantageously leads to reduced scattering of the electromagnetic radiation of the semiconductor chip, since its wavelength is too large for an interaction. The nanoparticles with the maximum diameter of 10 nanometers are able to change the refractive index of the potting without themselves acting as a scattering center for electromagnetic radiation of the semiconductor chip.

According to a further embodiment, the nanoparticles are coated with a shell. Preferably, the shell comprises a silicone and/or silicon dioxide or consists of a silicone and/or silicon dioxide. Particularly preferably, the shell is thin. "Thin" in this context means that the shell has a thickness between at least 1 nanometer and at most 5 nanometers.

Advantageously, the shell leads to a reduction of agglomeration of nanoparticles in the matrix material and/or to an improved mixing of the nanoparticles with the matrix material. Accordingly, a homogeneous distribution of the nanoparticles in the matrix material is improved.

According to a further embodiment, the concentration of the nanoparticles in the potting is at least 50 wt % and does not exceed 80 wt %, preferably 70 wt %. The concentration of the nanoparticles in the potting depends on the refractive index of the nanoparticles. The higher the refractive index of the nanoparticles, the lower the concentration of the nanoparticles can be chosen. In addition, the resulting refractive index of the potting also depends on the refractive index of the matrix material.

Preferably, the portion of the potting adjacent to the radiation exit surface of the semiconductor chip has a refractive index between 1.3 and 1.7 inclusive, more preferably between 1.41 and 1.62 inclusive. Particularly preferably, the portion of the potting adjacent to the radiation exit surface in this embodiment has a thickness of 30% of the total potting.

According to a further embodiment, phosphor particles that convert electromagnetic radiation of the first wavelength range into electromagnetic radiation of a second wavelength range different from the first wavelength range are embedded in the matrix material. In other words, the phosphor particles impart wavelength-converting properties to the potting.

By the term "wavelength-converting" is meant that irradiated electromagnetic radiation of a certain wavelength range is converted into electromagnetic radiation of another, preferably longer wavelength range. As a rule, a wavelength-converting element absorbs electromagnetic radiation of an irradiated wavelength range, converts it by electronic processes on the atomic and/or molecular level into electromagnetic radiation of another wavelength range and emits the converted electromagnetic radiation again. In particular, pure scattering or pure absorption is not understood as wavelength-converting. By combining phosphor particles emitting different colors, mixed light with a color locus in the white range, preferably warm white range, can be generated from blue electromagnetic radiation of the semiconductor chip.

According to one embodiment, the phosphor particles for producing warm white light have a concentration between 30% by weight and 40% by weight, inclusive, based on the weight of the entire potting.

According to one embodiment, the phosphor particles have a larger diameter than the nanoparticles. For example, the phosphor particles have a diameter between 1 micrometer and 30 micrometers inclusive.

The phosphor particles are preferably selected from a group of garnet phosphors and nitride phosphors. The garnet phosphor comprises a wurtzite crystal structure, wherein however the lattice sites are occupied by different elements. For example, a YAG phosphor with the chemical formula $Y_3Al_5O_{12}:Ce^{3+}$ or a LuAG phosphor with the chemical formula $Lu_3Al_5O_{12}:Ce^{3+}$ in which the yttrium is completely replaced by lutetium can be used. The group of nitride phosphors includes, for example, a SCASN phosphor with the chemical formula $(Ca,Sr)AlSiN_3:Eu^{2+}$.

Other possible materials for the phosphor particles include, in particular, the following aluminum-containing and/or silicon-containing phosphor particles:
$(Ba_{1-x-y}Sr_xCa_y)SiO_4:Eu^{2+}$ (0≤x≤1, 0≤y≤1), $(Ba_{1-x-y}Sr_xCa_y)_3SiO_5:Eu^{2+}$ (0≤x≤1, 0≤y≤1), $Li_2SrSiO_4:Eu^{2+}$, $Ca_8Mg(SiO_4)_4Cl_2:Eu^{2+}$, oxo-nitrides such as $(Ba_{1-x-y}Sr_xCa_y)Si_2O_2N_2:Eu^{2+}$ (0≤x≤1; 0≤y≤1), $SrSiAl_2O_3N_2:Eu^{2+}$, $Ba_{4-x}Ca_xSi_6ON_{10}:Eu^{2+}$ (0≤x≤1), $(Ba_{1-x}Sr_x)Y_2Si_2Al_2O_2N_5:Eu^{2+}$ (0≤x≤1), $Sr_xSi_{(6-y)}Al_yO_yN_{(8-y)}:Eu^{2+}$ (0.05≤x≤0.5; 0.001≤y≤0.5), $Ba_3Si_6O_{12}N_2:Eu^{2+}$, $Si_{6-z}Al_zO_zN_{8-z}:Eu^{2+}$ (0≤z≤0.42), $M_xSi_{12-m-n}Al_{m+n}O_nN_{16-n}:Eu^{2+}$ (M=Li, Mg, Ca, Y; x=m/v; v=valence of M, x≤2), $M_xSi_{12-m-n}Al_{m+n}O_nN_{16-n}:Ce^{3+}$, $AE_{2-x-a}RE_xEu_aSi_{1-y}O_{4-x-2y}N_x$ (AE=Sr, Ba, Ca, Mg; RE=rare earth elements), $AE_{2-x-a}RE_xEu_aSi_{1-y}O_{4-x-2y}N_x$ (AE=Sr, Ba, Ca, Mg; RE=rare earth elements) $Ba_3Si_6O_{12}N_2:Eu^{2+}$ or nitrides such as $La_3Si_6N_{11}:Ce^{3+}$, $(Ba_{1-x-y}Sr_xCa_y)_2Si_5N_8:Eu^{2+}$, $(Ca_{1-x-y}Sr_xBa_y)AlSiN_3:Eu^{2+}$ (0≤x≤1; 0≤y≤1), $Sr(Sr_{1-x}Ca_x)Al_2Si_2N_6:Eu^{2+}$ (0≤x≤0.2), $Sr(Sr_{1-x}Ca_x)Al_2Si_2N_6:Ce^{3+}$ (0≤x≤0.2) $SrAlSi_4N_7:Eu^{2+}$, $(Ba_{1-x-y}Sr_xCa_y)SiN_2:Eu^{2+}$ (0≤x≤1; 0≤y≤1), $(Ba_{1-x-y}Sr_xCa_y)SiN_2:Ce^{3+}$ (0≤x≤1; 0≤y≤1), $(Sr_{1-x}Ca_x)LiAl_3N_4:Eu^{2+}$ (0≤x≤1), $(Ba_{1-x-y}Sr_xCa_y)Mg_2Al_2N_4:Eu^{2+}$ (0≤x≤1; 0≤y≤1), $(Ba_{1-x-y}Sr_xCa_y)Mg_3SiN_4:Eu^{2+}$ (0≤x≤1; 0≤y≤1).

According to a preferred embodiment, the phosphor particles are comprised by a conversion layer. In addition to the phosphor particles, the conversion layer preferably comprises the matrix material. Typically, the phosphor particles have a larger refractive index than the matrix material and the nanoparticles.

According to a preferred embodiment, the nanoparticles are comprised by a particle layer. In addition to the nanoparticles, the particle layer comprises the matrix material. Preferably, the nanoparticles have a larger refractive index than the matrix material. Particularly preferably, the conversion layer and the particle layer together form the potting. Particularly preferably, the semiconductor chip is embedded in the conversion layer.

According to a preferred embodiment, the conversion layer is arranged closer to the radiation exit surface of the semiconductor chip than the particle layer. However, this arrangement does not exclude that nanoparticles are contained in the conversion layer as well as that phosphor particles are contained in the particle layer.

The thickness of the conversion layer is preferably greater than the thickness of the particle layer.

The radiation emitting device may be manufactured using the method described below. Features and embodiments implemented only in connection with the radiation emitting device can also be used in the method, and vice versa.

According to one embodiment of the method of manufacturing a radiation emitting device, a semiconductor chip that emits electromagnetic radiation of a first wavelength range from a radiation exit surface during operation is first provided in a cavity.

According to one embodiment of the method, a first liquid potting material is introduced into the cavity, wherein the first liquid potting material comprises a first matrix material and a plurality of nanoparticles.

According to a preferred embodiment, a second liquid potting material is introduced into the cavity, wherein the second liquid potting material comprises a second matrix material and is free of nanoparticles. The first and the second matrix material may differ from each other in this regard. Preferably, however, the matrix materials are the same.

According to one embodiment, the nanoparticles sediment in the matrix material. Simultaneously or alternatively, the second liquid potting material mixes with the first liquid potting material so that the concentration of nanoparticles in the matrix material, starting from the radiation exit surface of the semiconductor chip, decreases so that a refractive index of the potting, starting from the radiation exit surface of the semiconductor chip, decreases. Preferably, the first matrix material and the second matrix material comprise a low viscosity in the liquid state. For example, the viscosity of the liquid matrix material does not exceed 1 mPAs. A comparatively low viscosity of the matrix material is advantageous for the mixing process and/or the sedimentation process of the nanoparticles.

During sedimentation, the nanoparticles settle in the form of a layer due to the weight force at least on the radiation exit surface of the semiconductor chip. The settling of the nanoparticles can also be accelerated here by centrifugation. Also, the use of the matrix material with the low viscosity usually accelerates the sedimentation process. After the nanoparticles have settled, the matrix material is preferably cured. A characteristic of a particle layer applied by means of a sedimentation process is that all surfaces on which the particles can settle due to the weight force are coated with the particle layer.

In addition, the concentration of the nanoparticles in the potting material can be adjusted by the mixing process, for example diffusion. Here, the second liquid potting material mixes with the first liquid potting material to thus decrease the refractive index starting from the radiation exit surface of the semiconductor chip. Preferably, the nanoparticles are arranged at the radiation exit surface of the semiconductor chip.

According to a preferred embodiment of the method for manufacturing a radiation emitting device, a semiconductor chip that in operation emits electromagnetic radiation of a first wavelength range from a radiation exit surface is provided in a cavity, and a first liquid potting material is introduced into the cavity, wherein the first potting material comprises a first matrix material and a plurality of nanoparticles. A second liquid potting material is introduced into the cavity, wherein the second potting material comprises a second matrix material and is free of nanoparticles. The nanoparticles in the matrix material sediment and/or the second potting material is mixed with the first potting material such that the concentration of the nanoparticles in the matrix material decreases from the radiation exit surface of the semiconductor chip, such that a refractive index of the potting decreases from the radiation exit surface of the semiconductor chip.

According to a further embodiment, the sedimentation of the nanoparticles in the potting material is enhanced with the aid of a centrifuge. The centrifuge is capable of transporting the nanoparticles to the vicinity of the radiation exit surface of the semiconductor chip by a centrifugal force resulting from a uniform circular motion.

According to a further embodiment, a plurality of devices is arranged on a curved carrier of the centrifuge. Here, a center point of each device is preferably the same distance from a pivot point of the centrifuge. The center point of the device is the point which has the same distance from all points of the device. The pivot point is the area of the centrifuge about which the carrier is rotated. By having the same distance from the center point of each device to the pivot point of the centrifuge, a shorter distance can be obtained with advantage. The shorter distance between pivot point and the center point of each device advantageously leads to a higher rotation speed, which leads to a higher centrifugal force. The higher centrifugal force allows obtaining a faster and improved sedimentation of the nanoparticles, which leads to a decrease of the refractive index, starting from the radiation exit surface of the semiconductor chip. In addition, if the center point of each device has the same distance to a pivot point of the centrifuge, a more uniform layer formation can usually be achieved during sedimentation.

According to a further embodiment, the liquid potting material is cured after sedimentation and/or mixing. Preferably, a temperature between 100° C. and 200° C. inclusive is selected to cure the liquid potting material to a potting. For example, the liquid potting material is cured to a potting at about 150° C.

According to a further embodiment, the first liquid potting material and/or the second liquid potting material are applied by one of the following methods: spray coating, casting, jetting, (screen) printing, doctoring. Preferably, the thickness of the resulting potting can be adjusted in a desired manner.

According to a preferred embodiment, phosphor particles that convert electromagnetic radiation of the first wavelength range into electromagnetic radiation of the second wavelength range are introduced into the first matrix material. The phosphor particles generally also sediment during the sedimentation of the nanoparticles. In this case, the sedimentation of the phosphor particles, due to the generally larger diameter and a larger weight of the phosphor particles relative to the diameter and a weight of the nanoparticles, results in an arrangement in which the phosphor particles are arranged closer to the radiation exit surface of the semiconductor chip than the nanoparticles. The mixing of the first and second liquid potting materials, on the other hand, results in the nanoparticles and the phosphor particles being arranged near the radiation exit surface of the semiconductor chip, so that the refractive index decreases starting from the radiation exit surface.

One idea of the present device is to ensure a decrease of the refractive index within the potting starting from the radiation exit surface of the semiconductor chip. Thus, at the interface between the potting and the surrounding medium, losses of the electromagnetic radiation of the semiconductor chip due to refractive index jumps can be reduced with advantage. This leads to an improvement in the brightness of the semiconductor chip. In addition, when phosphor particles are added to the potting, the conversion takes place within an area that has a comparatively high refractive index. This minimizes scattering effects, resulting in a higher efficiency of the device.

In addition, it is possible to achieve a thinner potting so that the overall thickness of the device is reduced with advantage.

BRIEF DESCRIPTION OF THE DRAWINGS

Further advantageous embodiments and further embodiments of the device and the method result from the exemplary embodiments described below in connection with the figures.

Elements that are identical, similar or have the same effect are given the same reference signs in the figures. The figures and the proportions of the elements shown in the figures are not to be regarded as true to scale. Rather, individual elements, in particular layer thicknesses, may be shown exaggeratedly large for better representability and/or understanding.

DETAILED DESCRIPTION OF ILLUSTRATIVE EMBODIMENTS

Figure 1:
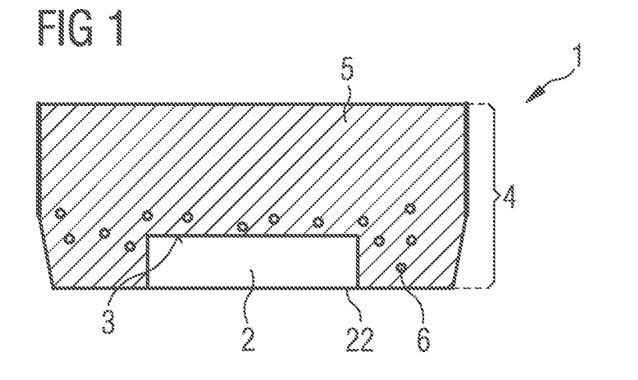
FIG. 1 and FIG. 2 show a schematic sectional view of a radiation emitting device according to each exemplary embodiment.

FIG. 1 shows a schematic sectional view of a radiation emitting device 1 comprising a semiconductor chip 2 which, in operation, emits electromagnetic radiation of a first wavelength range from a radiation exit surface 3. Further, the radiation emitting device 1 comprises a potting 4 comprising a matrix material 5 and a plurality of nanoparticles 6. The semiconductor chip 2 is surrounded by the potting 4. The surface of the semiconductor chip 2 opposite to the radiation exit surface 3 is disposed on a carrier element 22 for stabilization and is not surrounded by the potting 4. The concentration of the nanoparticles 6 in the matrix material 5 decreases starting from the radiation exit surface 3 of the semiconductor chip 2, so that a refractive index of the potting 4 decreases continuously starting from the radiation exit surface 3 of the semiconductor chip 2. That is, a portion of the potting 4 adjacent to the radiation exit surface 3 of the semiconductor chip 2 has a larger refractive index than a portion of the potting 4 located farther away from the semiconductor chip 2.

The matrix material 5 is selected from the group of polysiloxanes. Polysiloxanes are organosilicon compounds in which two silicon atoms are bonded to one another via an oxygen atom. Preferably, polysiloxanes have an organic group on the silicon atom. For example, the organic group is a methoxy, methyl, phenyl, or phenoxy group. The organic group of the polysiloxanes affects the refractive index of the matrix material. The polysiloxanes exhibit a high thermal stability and stability to the electromagnetic radiation of the semiconductor chip 2.

The nanoparticles 6 comprise a material or consist of a material selected from the group of metal oxides. The diameter of the nanoparticles 6 is not greater than 10 nanometers.

Figure 2:
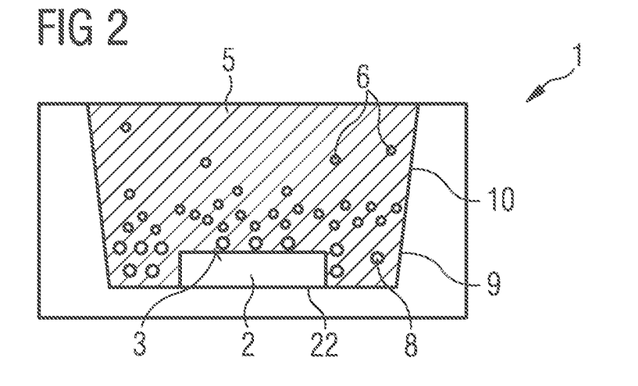

The radiation emitting device 1 according to the exemplary embodiment of FIG. 2 comprises a semiconductor chip 2, a carrier element 22, a conversion layer 9 and a particle layer 10. In operation, the semiconductor chip 2 emits electromagnetic radiation of a first wavelength range from a radiation exit surface 3. The semiconductor chip 2 is embedded in the conversion layer 9. The conversion layer 9 comprises phosphor particles 8 and a matrix material 5. The particle layer 10 is in direct contact with the conversion layer 9. The particle layer 10 comprises a matrix material 5 and nanoparticles 6. The particle layer 10 and the conversion layer 9 together form the potting 4. The conversion layer may also comprise nanoparticles 6 and the particle layer 10 may comprise phosphor particles 8.

The concentration of the nanoparticles 6 and the phosphor particles 8 in the matrix material 5 of the potting 4 decreases starting from the radiation exit surface 3 of the semiconductor chip 2, so that a refractive index of the potting 4 decreases starting from the radiation exit surface 3 of the semiconductor chip 2.

In the conversion layer 9, phosphor particles 8 are embedded in the matrix material 5. These convert electromagnetic radiation of the first wavelength range into electromagnetic radiation of a second wavelength range. In other words, the phosphor particles 8 impart wavelength-converting properties to the potting 4. The phosphor particles 8 comprise or are formed from a garnet phosphor and/or a nitride phosphor. Furthermore, the phosphor particles 8 have a larger diameter than the nanoparticles 6. In the present case, the phosphor particles 8 have a diameter between 1 micrometer inclusive and 30 micrometers inclusive.

Figure 3:
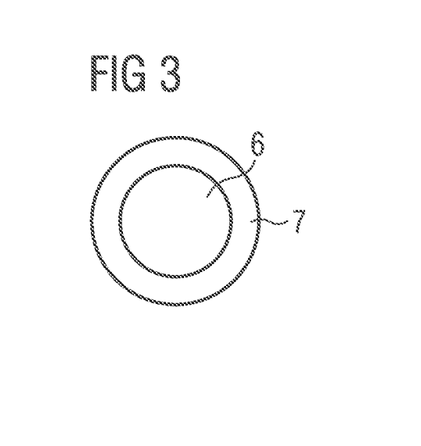
FIG. 3 shows a schematic sectional view of a nanoparticle according to an exemplary embodiment.

FIG. 3 shows a schematic sectional view of a nanoparticle 6 according to an exemplary embodiment. The nanoparticle 6 is coated with a shell 7. The shell 7 comprises a silicone and/or silicon dioxide or consists of a silicone and/or silicon dioxide. Preferably, the shell 7 is formed thin. "Thin" in this context means that the shell has a thickness between at least 1 nanometer and at most 5 nanometers. Advantageously, the shell 7 leads to a reduction in the agglomeration of nanoparticles 6 in the matrix material 5. A homogeneous distribution of the nanoparticles 6 in the matrix material 5 is consequently improved.

Figure 4:
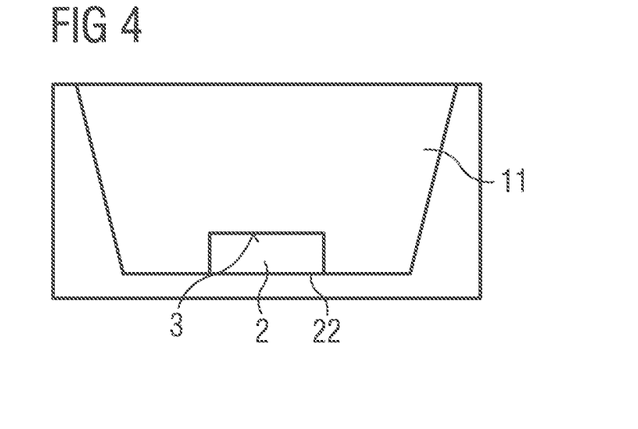
FIGS. 4, 5, 6, 7, and 8, respectively, show schematic sectional views for various method stages of a method for manufacturing a radiation emitting device according to an exemplary embodiment.

In the method according to the exemplary embodiment of FIGS. 4 to 8, a cavity 11 is provided in a first step (FIG. 4). The semiconductor chip 2, which in operation emits electromagnetic radiation of a first wavelength range from a radiation exit surface 3, is introduced into the cavity 11. The surface of the semiconductor chip 2 opposite the radiation exit surface 3 is arranged on a carrier element 22 for mechanical stabilization and is not surrounded by the potting 4.

Figure 5:
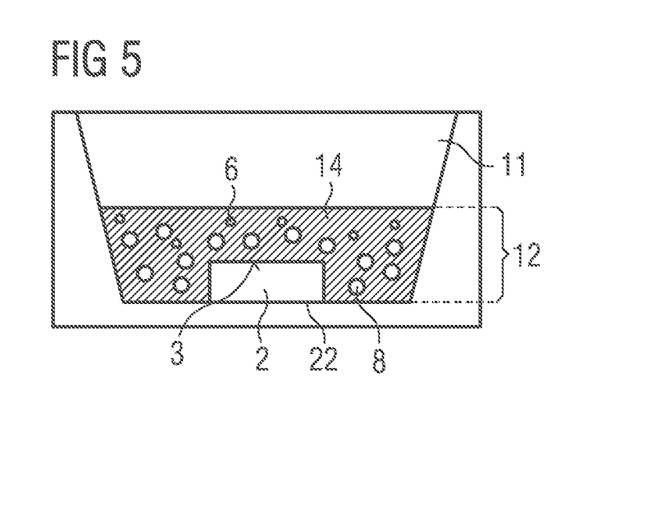

In a next step, a first liquid potting material 12 comprising nanoparticles 6, phosphor particles 8 and a first matrix material 14 is introduced into the cavity 11. Here, the semiconductor chip 2 is surrounded by the first liquid potting material 12. The first liquid potting material 12 may be introduced into the cavity 11 by spray coating or by casting.

Figure 6:
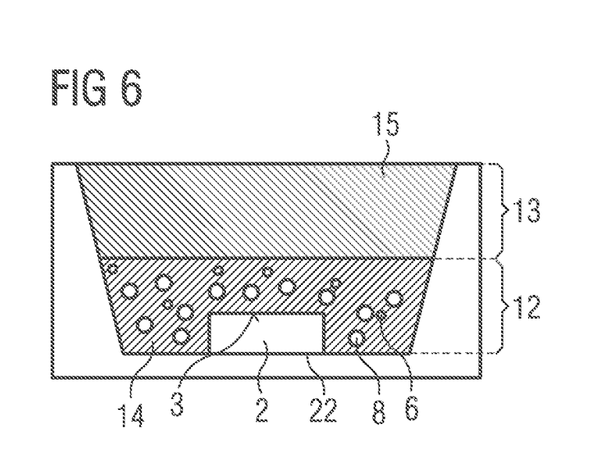

In a further step, a second liquid potting material 13 is introduced into the cavity 11 by casting or spray coating (FIG. 6). The second liquid potting material 13 comprises a second matrix material 15 and is presently free of nanoparticles 6 and free of phosphor particles 8. The matrix materials 14 and 15 may be the same. The first liquid potting material is not cured while the second liquid potting material is applied.

Figure 7:
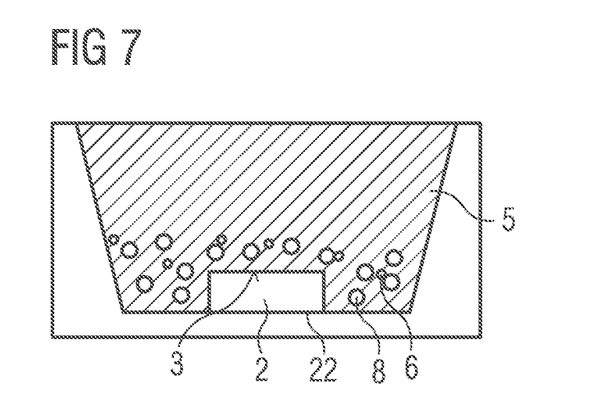

In a next step, the first liquid potting material 12 mixes with the second liquid potting material 13 so that the concentration of the nanoparticles 6 and the phosphor particles 8 in the matrix material 5, starting from the radiation exit surface 3 of the semiconductor chip 2, decreases. As a result, a refractive index of the potting 4, starting from the radiation exit surface 3 of the semiconductor chip, decreases (FIG. 7). Simultaneously or alternatively, the nanoparticles 6 and the phosphor particles 8 sediment in the matrix material 5 due to the gravitational force acting on them. Due to the generally larger diameter and a larger weight of the phosphor particles 8 in relation to the diameter and a weight of the nanoparticles 6, the sedimentation of the phosphor particles 8 here leads to an arrangement in which the phosphor particles 8 are arranged closer to the radiation exit surface 3 of the semiconductor chip 2 than the nanoparticles 6. The first matrix material 14 and the second matrix material 15 have a low viscosity in the liquid state.

Figure 8:
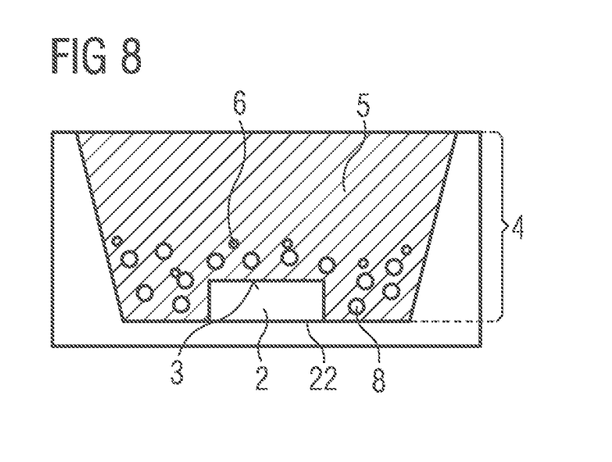

As shown in FIG. 8, in a final step of the method, the liquid potting material 12 and 13 is cured after sedimentation and/or mixing. For example, the liquid potting material 12 and 13 is cured at about 150° C. to form a potting 4. In this method, the potting 4 is formed.

Figure 9:
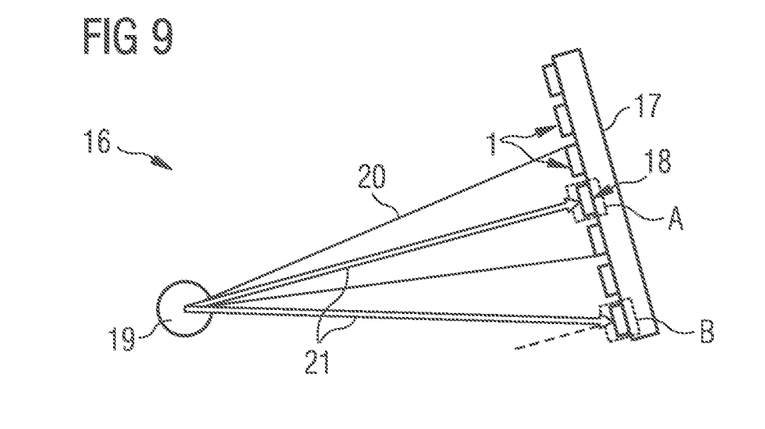
FIGS. 9, 10, 11 show method stages of a conventional method of manufacturing a radiation emitting device.

In the conventional method shown in FIG. 9, a centrifuge 16 is used. A plurality of devices 1 are arranged on a flat carrier 17. The plurality of devices 1 are rotated on the carrier 17 about a pivot point 19. The distances 20 between a pivot point 19 and a center point of each device 18 are different from each other. A centrifugal force direction 21 of the centrifugal force acting on the devices 1 is indicated by arrows. The centrifuge 16 is capable of conveying the nanoparticles 6 to the vicinity of the radiation exit surface 3 of the semiconductor chip 2 by a centrifugal force due to a uniform circular motion of the carrier around the pivot point 19.

Figure 10:
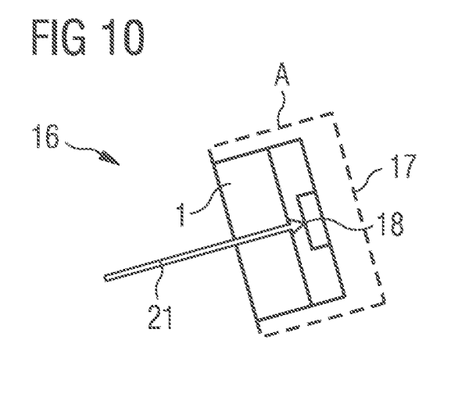

FIG. 10 shows a section marked A in FIG. 9, in which a base surface of the device 1 is perpendicular to the centrifugal force direction 21 and thus feels an almost homogeneous centrifugal force over an entire base surface. This arrangement leads to an almost homogeneous sedimentation of the nanoparticles in the liquid potting material.

Figure 11:
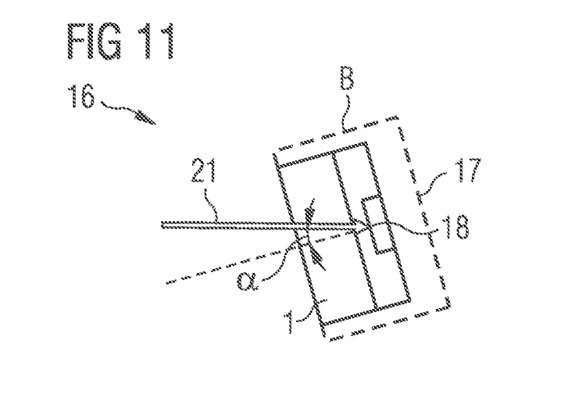

FIG. 11 shows a section marked B in FIG. 9, which is different from section A. The base surface of the device 1 according to FIG. 11 is not perpendicular to the centrifugal force direction 21, but encloses an acute angle with the centrifugal force direction 21. Thus, the device 1 according to FIG. 9 feels an inhomogeneous centrifugal force over its entire base surface. This arrangement leads to inhomogeneous sedimentation of the nanoparticles in the liquid potting material.

Figure 12:
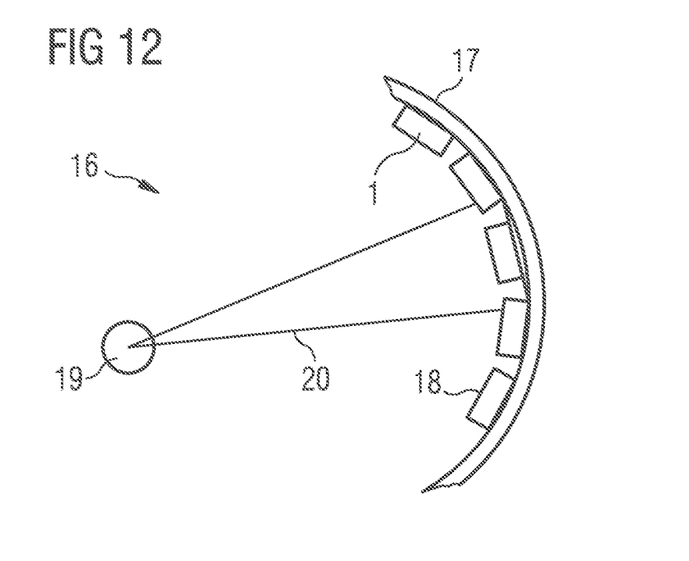
FIG. 12 shows a method stage of a method for manufacturing a radiation emitting device according to an exemplary embodiment.

In the method according to the exemplary embodiment of FIG. 12, a plurality of devices 1 are arranged on a curved carrier 17. A center point 18 of each device 1 to the pivot point 19 of the centrifuge 16 has the same distance 20 to the pivot point 19 of the centrifuge 16. In this case, a shorter distance 20 between the pivot point 19 and the center point of each device 18 can be selected with advantage, which results in a high centrifugal force. Thus, the nanoparticles 6 can be sedimented more easily and more quickly, which leads to a uniform layer formation during the sedimentation.

The invention is not limited to these by the description based on the exemplary embodiments. Rather, the invention encompasses any new feature as well as any combination of features, which in particular includes any combination of features in the patent claims, even if this feature or combination itself is not explicitly stated in the patent claims or exemplary embodiments.

The invention claimed is:

1. A radiation emitting device comprising:
   a semiconductor chip configured to emit electromagnetic radiation of a first wavelength range from a radiation exit surface;
   a potting comprising a matrix material and a plurality of nanoparticles; and
   a plurality of phosphor particles embedded in the matrix material,
   wherein the plurality of phosphor particles are configured to convert the electromagnetic radiation of the first wavelength range into electromagnetic radiation of a second wavelength range,
   wherein a concentration of the nanoparticles in the matrix material decreases starting from the radiation exit surface of the semiconductor chip so that a refractive index of the potting decreases starting from the radiation exit surface of the semiconductor chip,
   wherein the nanoparticles are coated with a shell, and
   wherein the shell comprises a thickness between at least 1 nanometer and at most 5 nanometers, inclusive.

2. The radiation emitting device according to claim 1, wherein the refractive index of the potting decreases continuously starting from the radiation exit surface.

3. The radiation emitting device according to claim 1, wherein the matrix material is selected from polysiloxanes.

4. The radiation emitting device according to claim 1, wherein the nanoparticles comprise a material selected from metal oxides.

5. The radiation emitting device according to claim 1, wherein a diameter of the nanoparticles is not larger than 10 nanometers.

6. The radiation emitting device according to claim 1, wherein a concentration of the nanoparticles in the potting is greater than 50% by weight and does not exceed 80% by weight.

7. The radiation emitting device according to claim 1, wherein the semiconductor chip is embedded in the potting.

8. The radiation emitting device according to claim 1,
   wherein the phosphor particles are comprised by a conversion layer,
   wherein the nanoparticles are comprised by a particle layer, and
   wherein the conversion layer is arranged closer to the radiation exit surface of the semiconductor chip than the particle layer.

9. The radiation emitting device according to claim 1, wherein the shell comprises a silicone and/or silicon dioxide or consists of silicone and/or silicon dioxide.

10. A method for manufacturing a radiation emitting device, the method comprising:
    providing, in a cavity, a semiconductor chip, the semiconductor chip configured to emit electromagnetic radiation of a first wavelength range from a radiation exit surface;
    introducing a first liquid potting material into the cavity, wherein the first liquid potting material comprising a first matrix material and a plurality of nanoparticles;
    introducing a second liquid potting material into the cavity, wherein the second liquid potting material comprises a second matrix material and is free of nanoparticles; and
    sedimenting the nanoparticles in the first matrix material and/or mixing the second liquid potting material with the first liquid potting material so that a concentration of the nanoparticles in the matrix material decreases starting from the radiation exit surface of the semiconductor chip and so that a refractive index of the first liquid potting material and the second liquid potting material decreases starting from the radiation exit surface of the semiconductor chip, wherein a diameter of the nanoparticles is not larger than 10 nanometers, and wherein the nanoparticles are coated with a shell and the shell comprises a thickness between at least 1 nanometer and at most 5 nanometers.

11. The method according to claim 10, wherein a continuous decrease in the refractive index of the first liquid potting material and the second liquid potting material is achieved starting from the radiation exit surface.

12. The method according to claim 10, wherein sedimenting the nanoparticles in the first liquid potting material and the second liquid potting material is enhanced with a centrifuge.

13. The method according to claim 12, wherein a plurality of devices are arranged on a curved carrier of the centrifuge.

14. The method according to claim 13, wherein a center point of each device of the plurality of devices has a same distance to a pivot point of the centrifuge.

15. The method according to claim 10, wherein the first and second liquid potting materials are cured after the sedimentation and/or the mixing.

16. The method according to claim 10, wherein the first liquid potting material and/or the second liquid potting material are applied by one of the following methods: spray coating, casting, jetting, (screen) printing, or doctoring.

17. The method according to claim 10, further comprising introducing phosphor particles into the first matrix material, wherein the phosphor particles are configured to convert the electromagnetic radiation of the first wavelength range into electromagnetic radiation of a second wavelength range.

18. A radiation emitting device comprising:
a semiconductor chip configured to emit electromagnetic radiation of a first wavelength range from a radiation exit surface;
a potting comprising a matrix material and a plurality of nanoparticles; and
a plurality of phosphor particles embedded in the matrix material,
wherein the plurality of phosphor particles are configured to convert the electromagnetic radiation of the first wavelength range into electromagnetic radiation of a second wavelength range,
wherein a concentration of the nanoparticles in the matrix material decreases starting from the radiation exit surface of the semiconductor chip so that a refractive index of the potting decreases starting from the radiation exit surface of the semiconductor chip,
wherein the nanoparticles are coated with a shell, and
wherein the shell comprises a thickness between at least 1 nanometer and at most 5 nanometers, inclusive, and
wherein a change in the refractive index is constant as a function of a distance from the radiation exit surface.

* * * * *